United States Patent
Defigueiredo et al.

(10) Patent No.: US 10,506,708 B2
(45) Date of Patent: Dec. 10, 2019

(54) FLEXIBLE AND CONFORMAL ELECTRONICS USING RIGID SUBSTRATES

(71) Applicant: Brigham Young University (BYU), Provo, UT (US)

(72) Inventors: Bryce Parker Defigueiredo, Canyon Country, CA (US); Spencer Magleby, Provo, UT (US); Larry Howell, Orem, UT (US)

(73) Assignee: Brigham Young University (BYU), Provo, UT (US)

( * ) Notice: Subject to any disclaimer, the term of this patent is extended or adjusted under 35 U.S.C. 154(b) by 0 days.

(21) Appl. No.: 15/650,453

(22) Filed: Jul. 14, 2017

(65) Prior Publication Data

US 2018/0020536 A1    Jan. 18, 2018

Related U.S. Application Data

(60) Provisional application No. 62/362,314, filed on Jul. 14, 2016.

(51) Int. Cl.
| | |
|---|---|
| *H05K 1/02* | (2006.01) |
| *H05K 1/18* | (2006.01) |
| *H05K 3/00* | (2006.01) |
| *H05K 3/46* | (2006.01) |
| *H01L 31/042* | (2014.01) |

(Continued)

(52) U.S. Cl.
CPC ........... *H05K 1/028* (2013.01); *H01L 31/042* (2013.01); *H02S 30/20* (2014.12); *H02S 40/36* (2014.12); *H05K 1/0278* (2013.01); *H05K 1/18* (2013.01); *H05K 3/0011* (2013.01); *H05K 3/4691* (2013.01); *H05K 1/148* (2013.01); *H05K 2201/055* (2013.01); *H05K 2201/09063* (2013.01); *H05K 2201/10143* (2013.01)

(58) Field of Classification Search
CPC ......... H05K 1/028; H05K 1/18; H05K 3/4691
See application file for complete search history.

(56) References Cited

U.S. PATENT DOCUMENTS

| | | | |
|---|---|---|---|
| 6,104,464 A * | 8/2000 | Adachi | ............... G02F 1/13452 257/E23.177 |
| 8,883,287 B2 | 11/2014 | Boyce et al. | |

(Continued)

OTHER PUBLICATIONS

Joseph O. Jacobsen, Guimin Chen, Larry L. Howell, Spencer P. Magleby; Lamina Emergent Torsional (LET) Joint; Jul. 12, 2009; Elsevier; Mechanism and Machine Theory vol. 44, Issue 11; pp. 2098-2109.*

(Continued)

*Primary Examiner* — William H. Mayo, III
*Assistant Examiner* — Hiram E Gonzalez
(74) *Attorney, Agent, or Firm* — Brake Hughes Bellermann LLP

(57) ABSTRACT

A flexible electronics assembly includes a single-piece substrate having two regions of rigidity separated by a localized region of flexibility. The localized region of flexibility has a lower rigidity than the two regions of rigidity. The two regions of rigidity are angularly deflectable from a planar configuration of the single-piece substrate to a non-planar configuration of the single-piece substrate by hinging action of the localized region of flexibility. At least one electronic component is mounted on at least one of the two regions of rigidity.

18 Claims, 15 Drawing Sheets

(51) Int. Cl.
*H02S 30/20* (2014.01)
*H02S 40/36* (2014.01)
*H05K 1/14* (2006.01)

(56) References Cited

U.S. PATENT DOCUMENTS

| | | | |
|---|---|---|---|
| 9,157,497 B1 | 10/2015 | Magleby et al. | |
| 9,167,685 B2 * | 10/2015 | Ikemoto | H05K 1/0281 |
| 9,672,970 B2 * | 6/2017 | Yosui | H01F 27/2804 |
| 2007/0281499 A1 * | 12/2007 | Muro | H05K 1/0278 |
| | | | 439/26 |

OTHER PUBLICATIONS

I. Delimont et al.: "A Family of Dual-Segment Compliant Joints Suitable for Use as Surrogate Folds", Journal of Mechanical Design, vol. 137, Sep. 2015, 9 pages.

* cited by examiner

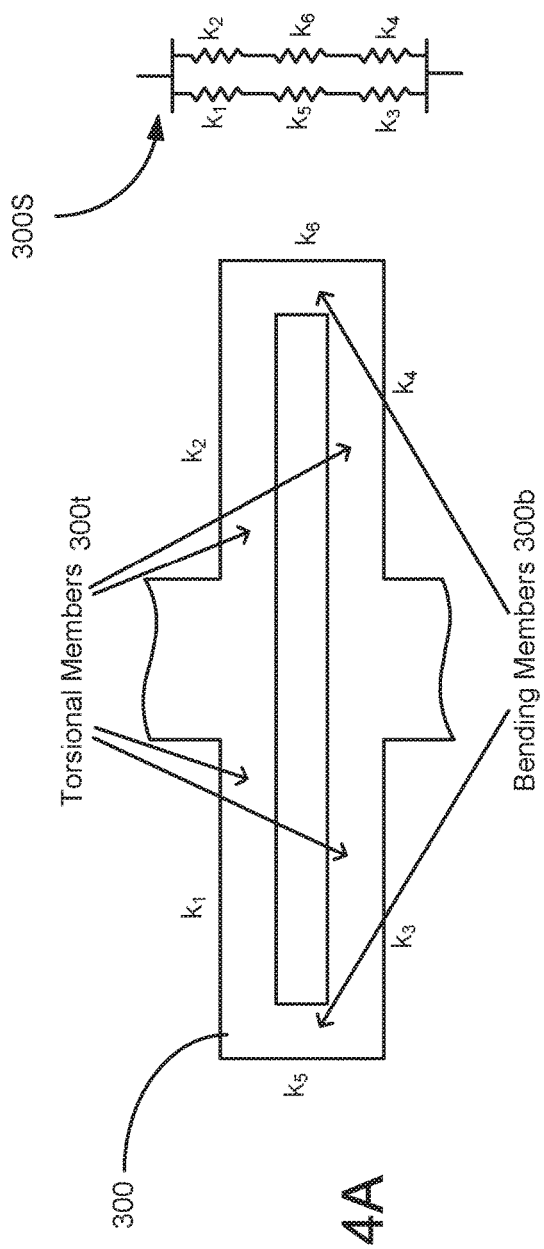
FIG. 4A (a) single LET joint with corresponding spring system
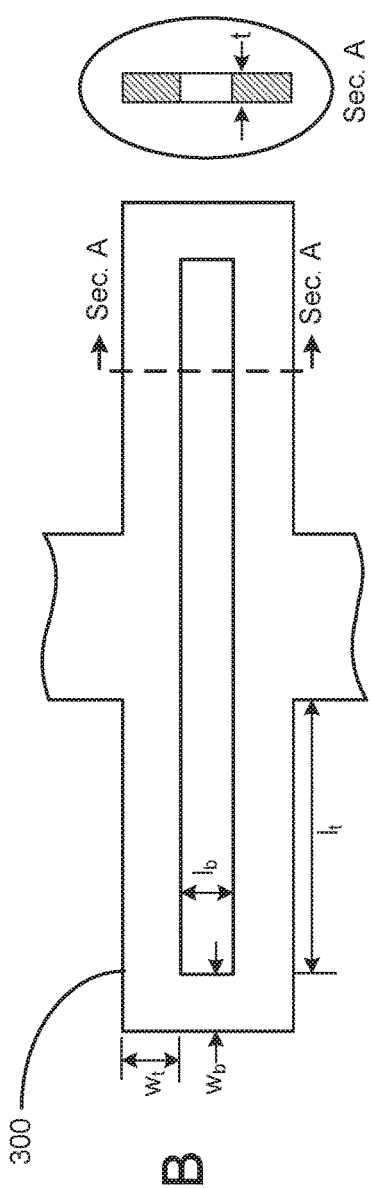
FIG. 4B (b) single LET joint with geometric parameters labeled Deflected LET Joint with parameters from Eq. 1 labled

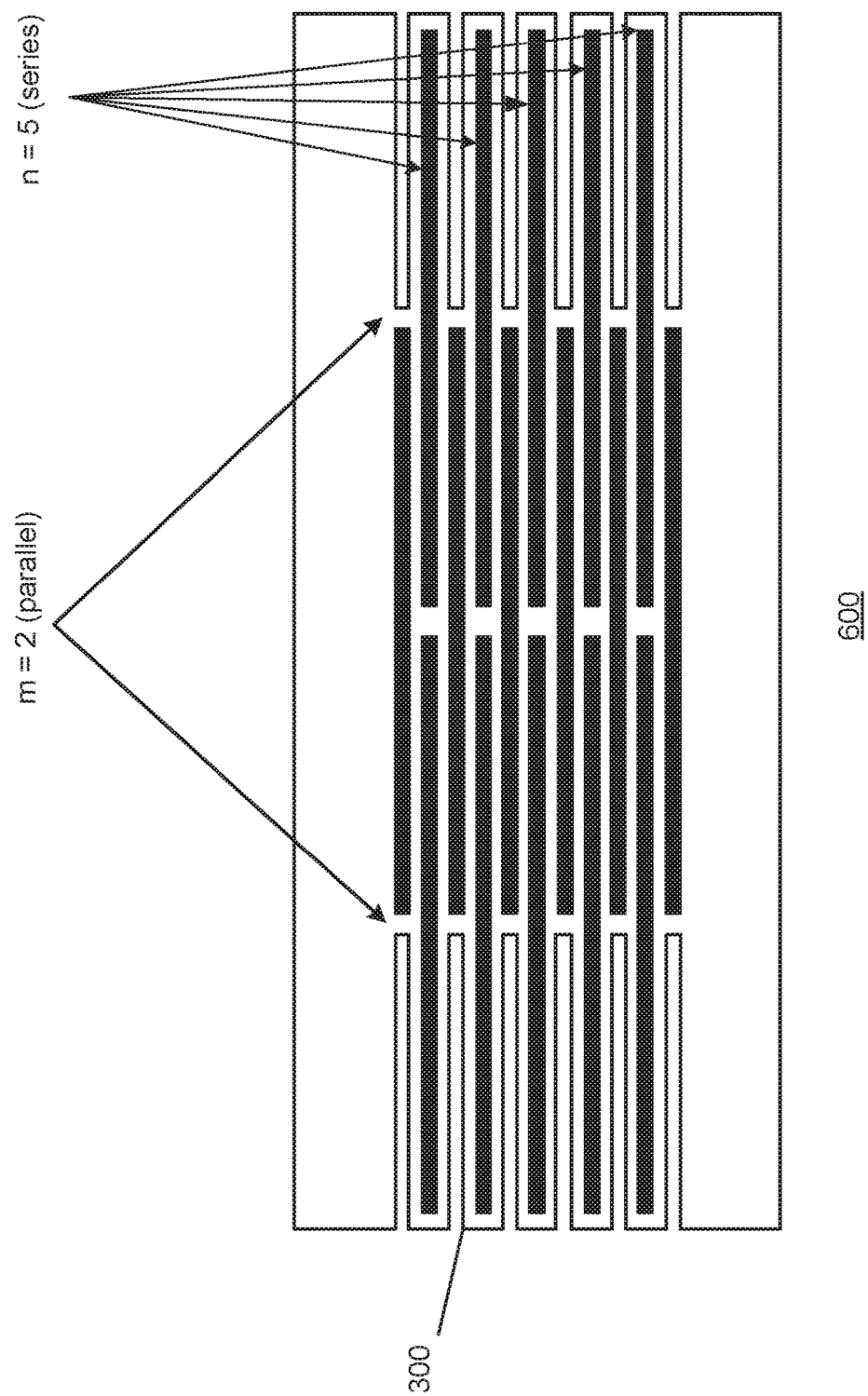

TABLE 1

| Array Size (m×n) | Analytical Max Stress (MPa) | FEA Max Stress (MPa) | Error (%) |
|---|---|---|---|
| 1x1 | 1658.5 | 1746.0 | 5.28 |
| 1x2 | 829.3 | 887.4 | 7.01 |
| 1x3 | 552.8 | 593.6 | 7.38 |
| 1x4 | 414.6 | 445.3 | 7.40 |
| 1x5 | 331.7 | 357.0 | 7.63 |
| 1x6 | 276.4 | 297.4 | 7.61 |
| 1x7 | 236.9 | 255.2 | 7.72 |
| 2x1 | 1658.5 | 1757.3 | 7.82 |
| 2x2 | 829.3 | 887.0 | 6.96 |
| 2x8 | 207.3 | 223.7 | 7.91 |
| 2x10 | 165.9 | 178.8 | 7.82 |

FIG. 6B

TABLE 2

| Trace | Resistance before test (Ω) | Resistance after test (Ω) | Change |
|---|---|---|---|
| Board 1 | | | |
| A | 0.412 | 0.417 | 1.4% |
| B | 0.431 | 0.442 | 2.6% |
| C | 0.422 | 0.425 | 0.8% |
| D | 0.413 | 0.437 | 5.8% |
| Board 2 | | | |
| A | 0.422 | 0.438 | 3.8% |
| B | 0.418 | 0.433 | 3.7% |
| C | 0.417 | 0.408 | -2.0% |
| D | 0.414 | 0.410 | -0.9% |
| Average change | | | 1.9% |

```
┌─────────────────────────────────────────────────────────────┐
│ Geometrically modifying a single-piece substrate to include a │
│ localized region of flexibility separating two regions of rigidity │
│                          1110                                │
└─────────────────────────────────────────────────────────────┘
                              │
                              ▼
┌─────────────────────────────────────────────────────────────┐
│ Using the localized region of flexibility separating the two regions │
│  of rigidity as a hinge in the single-piece substrate to angularly │
│  deflect the two regions of rigidity from a planar configuration of │
│   the single-piece substrate to a non-planar configuration of the │
│                    single-piece substrate                    │
│                          1120                                │
└─────────────────────────────────────────────────────────────┘
```

FLEXIBLE AND CONFORMAL ELECTRONICS USING RIGID SUBSTRATES

CROSS REFERENCE TO RELATED APPLICATION

This application is a Non-provisional of, and claims to priority to, U.S. Provisional Application No. 62/362,314, entitled: "Flexible and conformal electronics using rigid substrates," filed on Jul. 14, 2016, which is hereby incorporated by reference in its entirety herein.

STATEMENT REGARDING FEDERALLY SPONSORED RESEARCH

This invention was made with government support under NSF Grant No. EFRI-ODISSEI-1240417 funded by the National Science Foundation. The government has certain rights in the invention.

TECHNICAL FIELD

This disclosure relates to the use of compliant mechanisms in flexible electronics.

BACKGROUND

In traditional electronics, electronic components (e.g., integrated circuits, solar cells, etc.) are mounted on rigid printed circuit boards (PCBs) for mechanical support and ease of manufacturing. The PCBs, which may be copper clad, may be made of high strength glass-reinforced epoxy laminates with physical and chemical properties that conform to industry standard grades (e.g., G10, G11, FR4, FR5 and FR6) regulated by the National Electrical Manufacturers Association (NEMA). Rigid PCBs may not be desirable in many applications.

SUMMARY

In a general aspect, a flexible electronics assembly is made from a single-piece substrate. The substrate includes two regions of rigidity separated by a localized region of flexibility having a lower rigidity than the two regions of rigidity. At least one electronic component is mounted on at least one of the two regions of rigidity. The two regions of rigidity are angularly deflectable from a planar configuration of the single-piece substrate to a non-planar configuration of the single-piece substrate by hinging action of the localized region of flexibility. The localized region of flexibility elastically accommodates substantially all stresses and strains in the single-piece substrate caused by angular deflection of the two regions of rigidity.

In an aspect, the localized region of flexibility is a geometrically modified region of the single-piece substrate, which includes at least one compliant joint (e.g., a lamina emergent torsional (LET) joint) formed by geometrical shaping of the single-piece substrate. The compliant joint is configured to transfer a bending load associated with angular deflection of the two regions of rigidity and applied to the compliant joint as a torsional load on torsional members of the compliant joint.

In a further aspect, the single-piece substrate is a printed circuit board (PCB) (e.g., a conductor clad epoxy-glass laminate). An electrically conducting trace running across the localized region of flexibility provides an electrical connection to the at least one electronic component mounted on at least one of the two regions of rigidity.

In a general aspect, a method includes geometrically modifying a single-piece substrate to include a localized region of flexibility separating two regions of rigidity. The localized region of flexibility has a lower rigidity than the two adjoining regions of rigidity. The method includes configuring the localized region of flexibility separating the two regions of rigidity as a hinge to angularly deflect the two regions of rigidity from a planar configuration of the single-piece substrate to a non-planar configuration of the single-piece substrate.

In an aspect, geometrically modifying a single-piece substrate to include a localized region of flexibility includes configuring the localized region of flexibility to elastically accommodate substantially all stresses and strains in the single-piece substrate caused by angular deflection of the two regions of rigidity, for example, by forming at least one compliant joint by geometrical shaping of the single-piece substrate. The geometrical shaping of the single-piece substrate includes forming a lamina emergent torsional (LET) joint.

In an aspect, forming at least one compliant joint by geometrical shaping of the single-piece substrate includes forming a lamina emergent torsional (LET) joint or an array of such joints. An example LET joint can include two torsional members and two bending members as sides of a rectangle circumscribing a rectangular slot cut in the localized region of flexibility.

In an aspect, the single-piece substrate is a conductor clad printed circuit board (PCB) with physical and chemical properties that conform to industry standard grades regulated by the National Electrical Manufacturers Association (NEMA), and geometrically modifying the single-piece substrate to include a localized region of flexibility includes forming an electrically conducting trace running across the localized region of flexibility.

In a further aspect, geometrically modifying the single-piece substrate to include a localized region of flexibility includes forming a plurality of localized regions of flexibility along fold axes of an origami pattern (e.g., a map fold origami pattern).

BRIEF DESCRIPTION OF THE DRAWINGS

FIG. 4A is an illustration of an LET joint being represented by a corresponding spring system for an analytical model, in accordance with the principles of the present disclosure.

FIG. 4B is a drawing illustration of the dimensional parameters of a LET joint used in an analytical model of the LET joint, in accordance with the principles of the present disclosure.

FIG. 6A is a schematic illustration of an example array of LET joints.

FIG. 6B is a table comparing results of an analytical model expression and finite element analysis for the Von Mises stress of an array of LET joints.

FIG. 8 is a table listing results of resistance measurements on the electrical connectivity of structures similar to those used in the prototype folding solar panel assembly of FIG. 7A.

FIG. 11 is an illustration of an example method for making PCB substrate-based flexible electronics, in accordance with the principles of the present disclosure.

DETAILED DESCRIPTION

Figure 1:
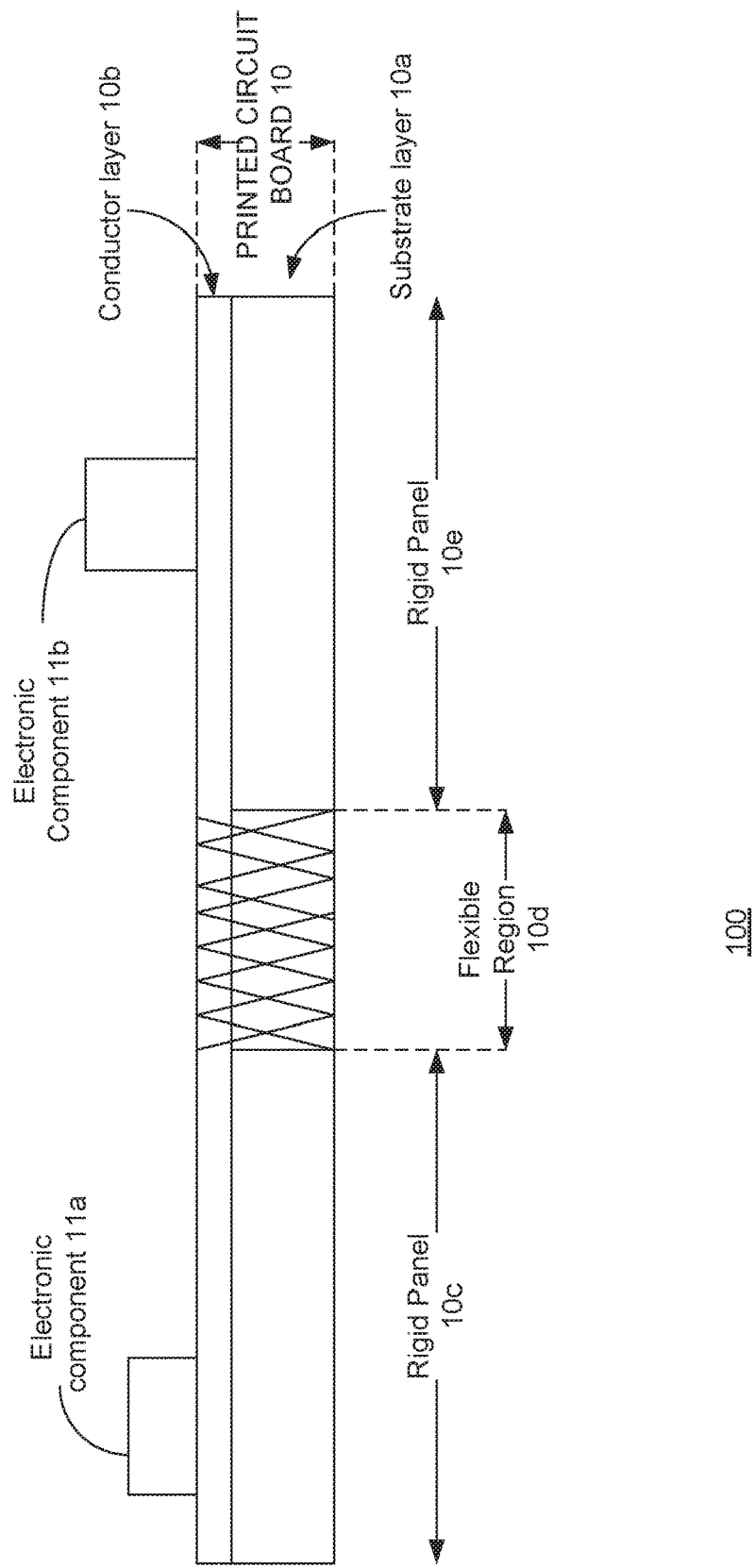
FIG. 1 is a cross-sectional view illustration of an example electronics assembly made in an initial planar configuration on a monolithic substrate having a localized region of flexibility, in accordance with the principles of the present disclosure.

Flexible electronics are used in a wide array of industries (e.g., aerospace, automotive, consumer electronics, and medical device industries) in applications where it is necessary confine electronics into small spaces or to conform the electronics to arbitrary shapes.

Flexible electronics are typically composed of a bilayer of thin passive, but flexible, substrate (e.g., plastic, textile, etc.) topped with a second layer of active electronic components. Flexible circuits are often used as connectors in various applications where flexibility, space savings, or production constraints limit the serviceability of rigid circuit boards or hand wiring.

The stiffness and rigidity of the traditional rigid PCBs limits use in applications that require high flexibility (i.e., flexible electronics). Modification of PCBs for use in flexible electronics can require thinning of the substrate material to reduce substrate stiffness and increase flexibility, but at the cost of reduced mechanical strength. However, the reduced substrate stiffness v. mechanical strength trade-offs can cause undesirable behavior in some parts of the electronics. In particular, fatigue due to repeated mechanical deflection of components mounted on thinned PCBs and their electrical connectors can lead to electrical or mechanical degradation or failure.

Electronics assemblies built on compliant mechanisms, and methods for making the same are described herein.

A compliant mechanism may be an otherwise rigid monolithic (i.e., single-piece, all formed of the same material or from a single piece of material) substrate (e.g., a printed circuit board (PCB) substrate) that is geometrically shaped or modified to include at least a localized region of low stiffness, in accordance with the principles of the present disclosure. The localized region of low stiffness (e.g., lower stiffness than adjacent or other regions), which can act as a flexible hinge or fold, is obtained by modification of local geometric features of the localized region. In contrast, traditional methods for obtaining low stiffness substrates (e.g., by material selection) may involve reducing the stiffness of the PCB substrate globally.

In some implementations, multiple localized regions can be included in a PCB. The multiple localized regions may be aligned along different directions (e.g., non-parallel, perpendicular) and/or may be included in a portion (rather across the entirety of) a PCB.

A localized region of low stiffness of the compliant mechanisms disclosed herein may include one or more compliant joints.

The terms rigidity and stiffness, which may be used interchangeably herein, are terms describing elastic properties of a material or object. The term flexible, can also refer to elastic properties of a material or object, and may be understood to be the converse of rigid. Further, the localized region of low stiffness may be referred to as the flexible region or the surrogate hinge.

While example embodiments described herein may include various modifications and alternative forms, embodiments thereof are shown by way of example in the drawings and will be described herein. It should be understood, however, that there is no intent to limit example embodiments to the particular forms disclosed, but on the contrary, example embodiments are to cover all modifications, equivalents, and alternatives falling within the scope of the claims. Furthermore, the figures are intended to illustrate the general characteristics of methods and/or structure utilized in certain example embodiments and to supplement the written description provided below. These figures are not, however, to scale and may not precisely reflect the precise structural or performance characteristics of any given embodiment, and should not be interpreted as defining or limiting the range of values or properties encompassed by example embodiments. For example, the structural elements may be reduced or exaggerated for clarity. The use of similar or identical reference numbers in the various drawings is intended to indicate the presence of a similar or identical element or feature.

An example electronics assembly may include a layer of one or more electronic or electrical devices (which can be referred to as electronic components), a patterned layer of a conductor material that electrically interconnects the one or more electronic components, and a supporting monolithic (i.e., single-piece) substrate. The monolithic substrate may be an otherwise rigid circuit board with two regions of rigidity (e.g., high rigidity) separated by a localized region of flexibility (e.g., low rigidity), in accordance with the principles of the present disclosure. The localized region of flexibility may have a rigidity that is lower than the rigidity of the two regions of rigidity. The localized region of flexibility may act as a surrogate hinge or joint that can be used to angularly deflect the two regions of rigidity of the monolithic substrate to a non-planar configuration without bending the two regions of rigidity or introducing stress or strain in the deflected regions of rigidity. Electronic components mounted on either of the two regions of rigidity may not suffer any additional stress or strain when the two regions of rigidity are deflected to the non-planar configuration from the initial planar configuration by hinging or bending action of the localized region of flexibility.

FIG. 1 is a cross-sectional view of an example electronics assembly 100 made in an initial planar configuration on a monolithic substrate having a localized region of flexibility, in accordance with the principles of the present disclosure.

Electronics assembly 100 may include a conductor layer 10a disposed on a monolithic substrate 10b. Conductor layer 10a may be obtained or included on substrate 10b as part of a printed circuit board (PCB) 10 (e.g., a single sheet of copper-clad FR-4 material). PCB 10 may include a localized region (e.g., flexible region 10d) of low rigidity or stiffness interposed between two regions of high rigidity (e.g., rigid panel 10c and rigid panel 10e).

In electronics assembly 100, electronic components (e.g., electronic component 11a and electronic component 11b) may be mounted (e.g., by soldering techniques) on the regions of high rigidity (e.g., rigid panel 10c and rigid panel 10e, respectively).

Figure 3A:
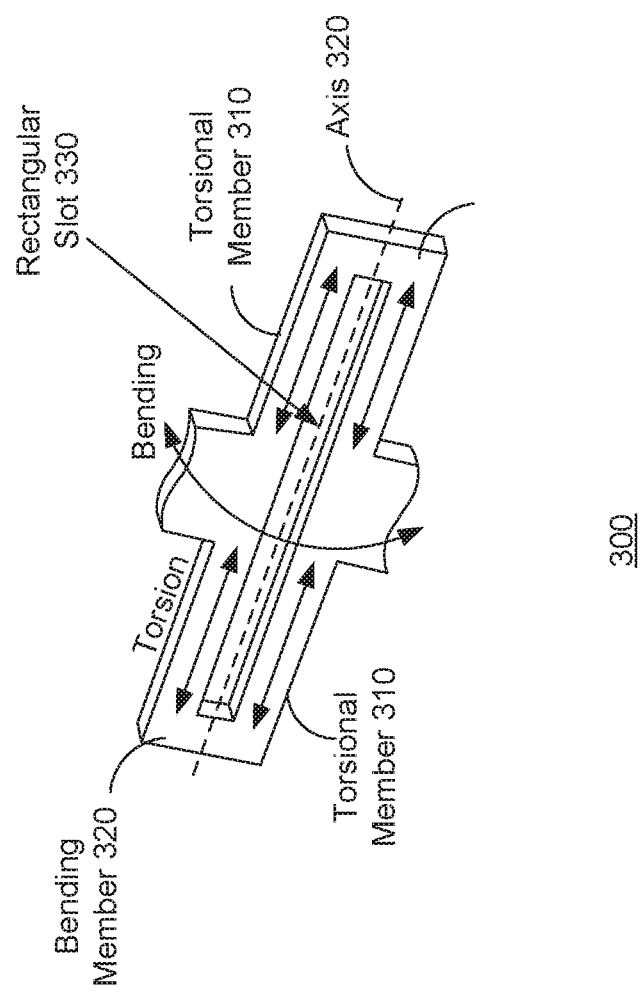
FIG. 3A is an illustration of an example lamina emergent torsional (LET) joint, in accordance with the principles of the present disclosure.

In example implementations, flexible region 10d may include one or more compliant joints (e.g., lamina emergent torsional (LET) joint 300, FIG. 3A). The compliant joints may be formed, for example, by geometrical shaping (e.g., by cutting, milling, etching, etc.) of PCB 10.

Figure 2:
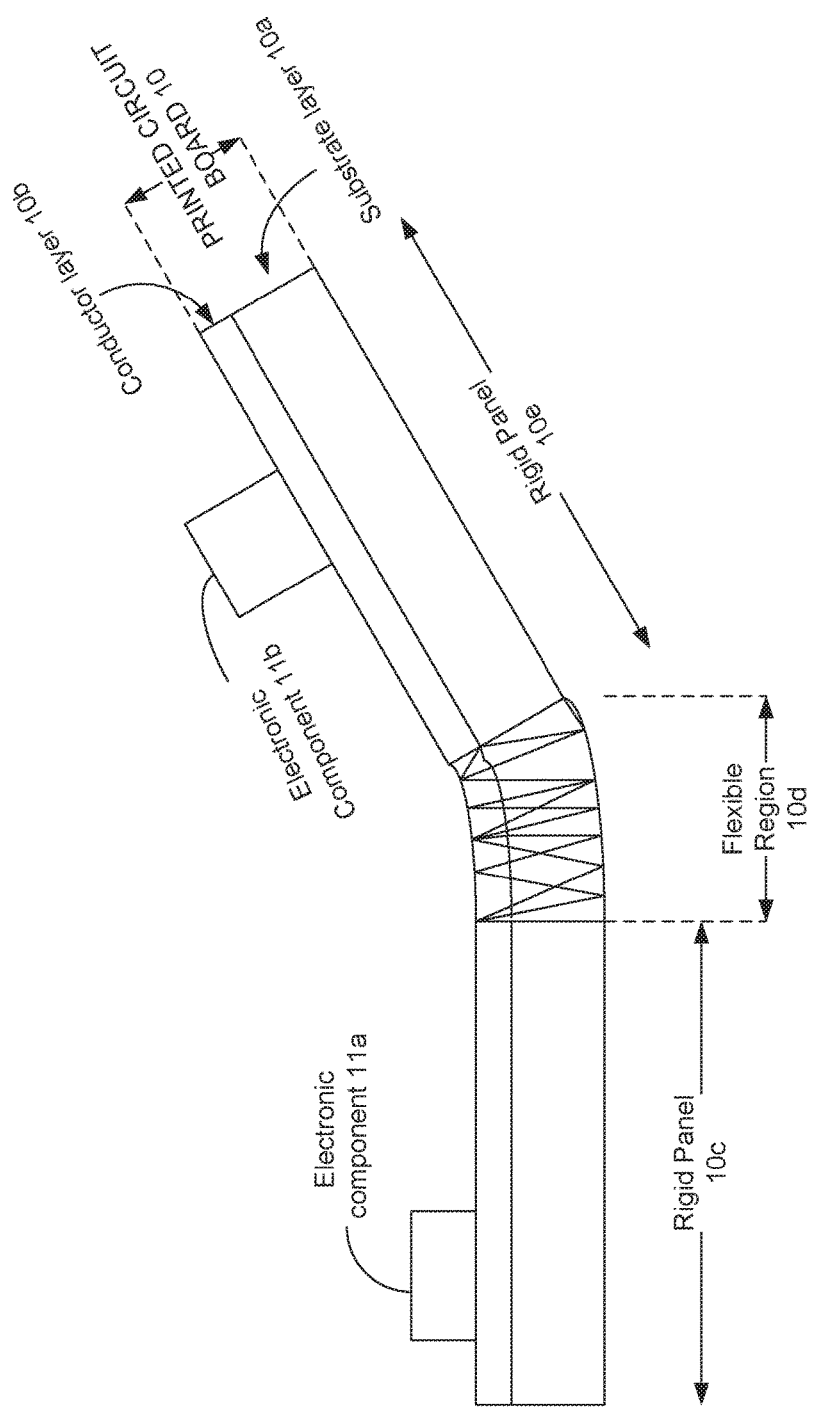
FIG. 2 is a cross-sectional view of the example electronics assembly of FIG. 1 with regions of high rigidity moved from the initial planar configuration to a relative non-planar configuration by hinging action of the localized flexible region, in accordance with the principles of the present disclosure.

FIG. 2 is a cross-sectional view of example electronics assembly 100 with the regions of high rigidity (e.g., rigid panel 10c and rigid panel 10e, respectively) moved or angularly deflected from the initial planar configuration shown in FIG. 1 to a relative non-planar configuration by hinging action of flexible region 10d, in accordance with the principles of the present disclosure. It may be noted that mechanical strains or stresses created in moving electronics assembly 100 to the relative non-planar configuration shown in FIG. 2 may be elastically accommodated in flexible region 10d by design of the geometric structure and parameters of flexible region 10d, in accordance with the principles of the present disclosure.

FIG. 3A shows, for example, the geometry of an example LET joint 300 that may be formed in flexible region 10d of PCB 10, in accordance with the principles of the present disclosure. LET joint 300 (as shown in FIG. 3A) has, for example, a rectangular slot geometry. LET joint 300 may, for example, include torsional members 310 and bending member 320 as sides of a rectangle circumscribing a rectangular slot 330 cut in flexible region 10d of PCB 10. The geometry of LET joint 300 may be designed so that a bending load (applied around axis 340) is transferred as a torsional load on torsional members 310 to lower the stiffness of flexible region 10d.

Further, flexible region 10d may be geometrically shaped to include multiple LET joints 300 that are disposed in an array (e.g., as a series and or a parallel pattern of joints) designed to reduce the stiffness of flexible region 10d to a target level. The multiple LET joints 300 may make flexible region 10d act as a flexible surrogate hinge or fold in PCB 10. The multiple LET joints 300 may serve a mechanical purpose of lowering the stiffness of flexible region 10d and also serve as an electrical connector between rigid panel 10c and rigid panel 10e by virtue of electrically conducting traces that may be formed by residual conductor layer 10b coupled to (e.g., deposited on) top of the multiple LET joints 300. The electrically conducting traces may be formed when flexible region 10d of PCB 10 is geometrically shaped (e.g., by cutting, milling, or etching) to form the multiple LET joints 300.

Figure 3B:
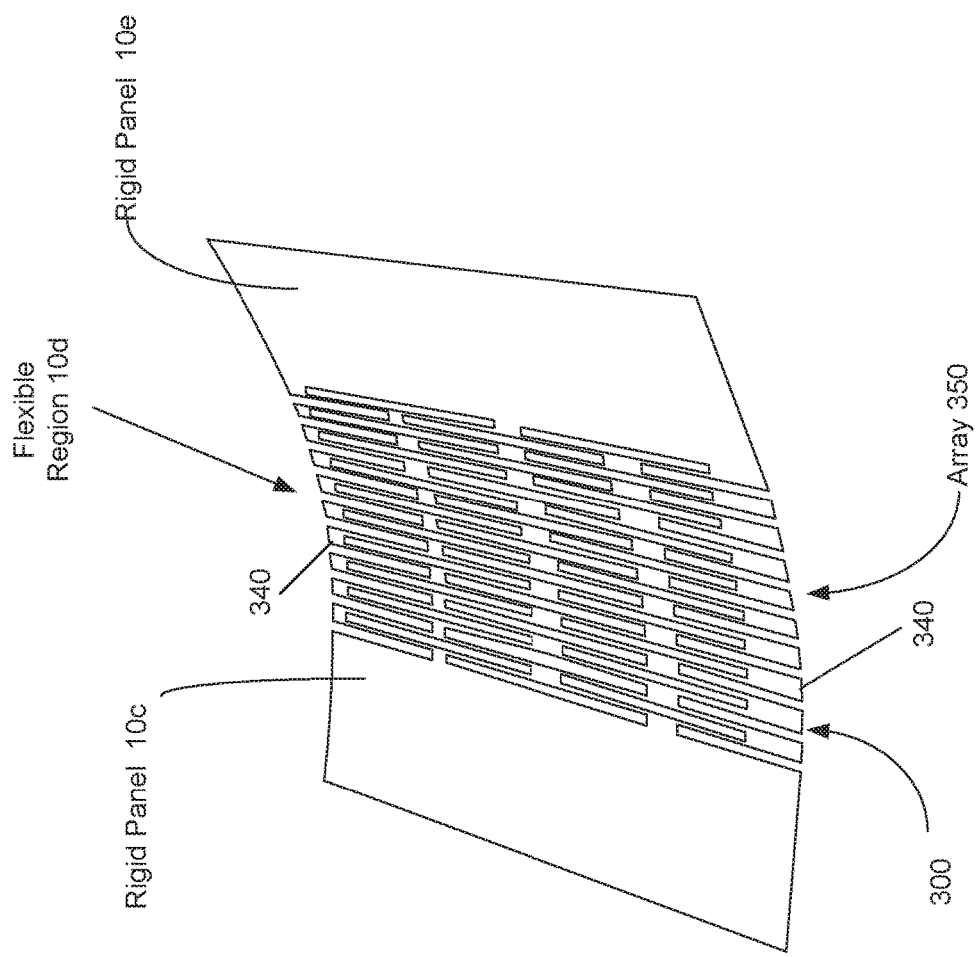
FIG. 3B is an illustration of a prototype array of LET joints, in accordance with the principles of the present disclosure.

FIG. 3B shows, for example, a prototype array 350 of LET joints 300 that may be formed in flexible region 10d of PCB 10, in accordance with the principles of the present disclosure. Array 350 may act as a surrogate hinge or fold allowing relative hinge-like motion of rigid panel 10c and rigid panel 10e (as shown, for example, in FIG. 2). Electrically conducting traces 340 formed in conductor layer 10b may run across LET joints 300 in array 350 to electrically connect electronic components (e.g., electrical components 11a and electrical component 11b shown in FIGS. 1 and 2) that may be disposed, for example, on rigid panel 10c and rigid panel 10e. Thus, array 350 formed in flexible region 10d of PCB 10 in addition to serving as a mechanical hinge can also serve as an electrical connector between rigid panel 10c and rigid panel 10e.

While a LET joint (e.g. LET joint 300) with a rectangular slot geometry has been used in the foregoing for purposes of illustration as an example type of surrogate hinge or fold that may be fabricated by geometric shaping of flexible region 10d of PCB 10, other additional or alternate types of surrogate hinges or folds may be used to make a compliant member with a hinge-like motion capability. The other additional or alternate types of surrogate hinges or folds may, for example, include inverted lamina emergent joints (I-LEJ), tension lamina emergent joints (T-LEJ), blending-orthogonal joints, inverted blending orthogonal joints, mixed tension resistant, mixed compression resistant joints, and/or torsion-parallel joints, etc.

Flexibility of flexible region 10d of PCB 10 may be controlled by modifying geometric parameters such as the number of arrayed LET joints and the dimensional parameters of the LETs (e.g., torsion member length, torsion member width, bending member length, bending member width, thickness t, etc.).

In example implementations, the type and the geometric dimensions of surrogate hinges or folds used in flexible region 10d may be determined for an electronic assembly application by analytical and/or finite element analysis ((FEA) modelling.

Analytical Model

An analytical model for analyzing a single LET joint (e.g., LET joint 300) and arrays of LET joints is described in more detail below. In the analytical model, single LET joint 300 is represented by a spring system. FIG. 4A shows, for example, LET joint 300 being represented by a corresponding spring system 300S. In spring system 300S, torsional members 310 of LET joint 300 are represented by springs with spring constants $k_1$-$k_4$ and bending members 320 are represented by springs with spring constants $k_5$ and $k_6$. Further, FIG. 4B shows, for reference, the dimensional parameters (e.g., torsion member length $l_t$, torsion member width $w_t$, bending member length $l_b$, bending member width $w_b$, and thickness t, etc.) of LET joint 300 that are used in the analytical model.

Figure 5:
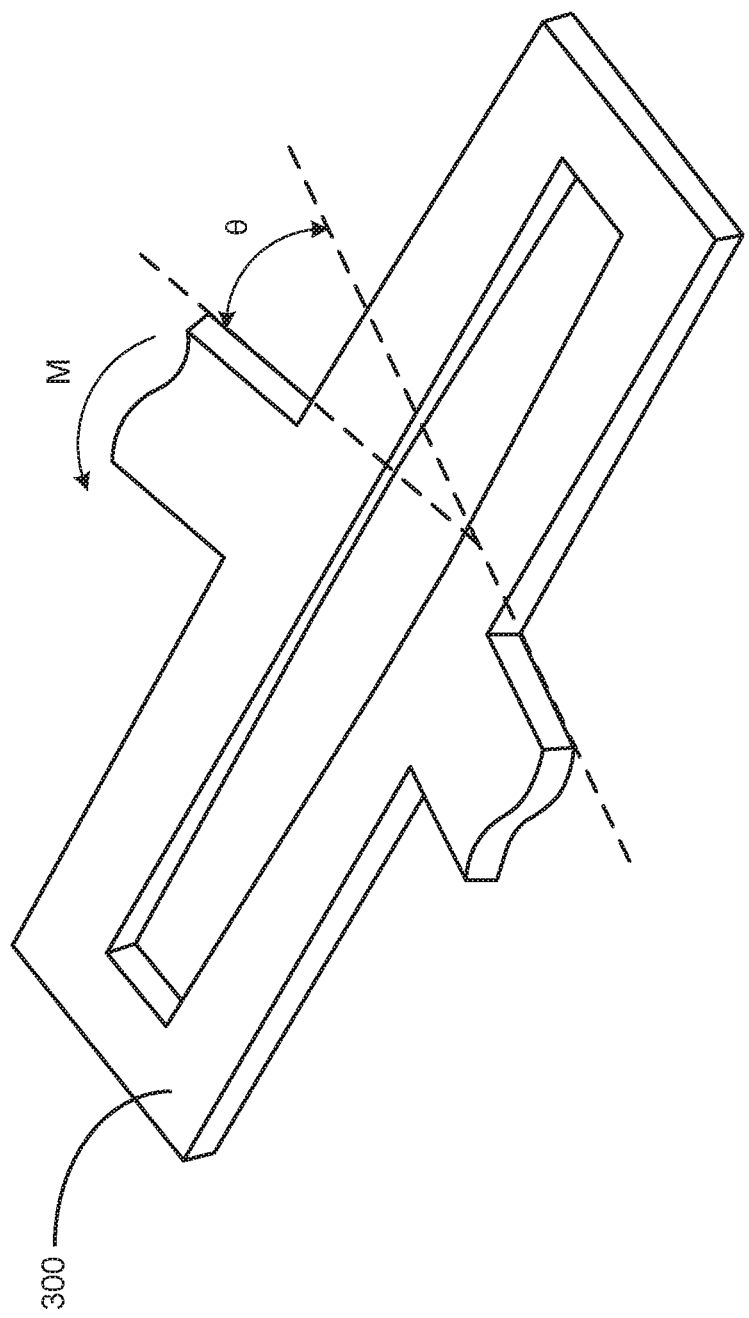
FIG. 5 is a schematic illustration of the moment on a LET joint resulting from an applied angular deflection.

The analytical model can assume, in some implementations, that a pure moment is applied to LET joint 300, and moment-deflection behavior of LET joint 300 is characterized by the equation:

$$M = k_{eq} * \theta \qquad (1)$$

where as shown in FIG. 5, M is the moment on the joint resulting from an applied angular deflection θ, and $k_{eq}$ is an equivalent spring constant based on a combination of spring constants $k_1$-$k_6$ of spring system 300S.

Combining the springs of spring system 300S results in an equivalent spring constant of $$k_{eq} = \frac{k_1 k_3 k_5}{k_1 k_3 + k_1 k_5 + k_3 k_5} + \frac{k_2 k_4 k_6}{k_2 k_4 + k_2 k_6 + k_4 k_6} \qquad (2)$$

Assuming that a symmetric LET joint is used $k_1=k_2=k_3=k_4$ and $k_5=k_6$ for the torsional members of the LET joint. Since $k_1$-$k_4$ are the stiffnesses of the symmetric torsional members, they may be represented as $k_t$. Likewise, $k_5$ and $k_6$ are the stiffnesses of the symmetric bending members and may be represented as $k_b$. Combining the above stiffnesses as springs in parallel and series (e.g. as shown in spring system 300S) yields the equivalent stiffness of a single LET joint in terms of the stiffness of its torsional and bending members as:

$$k_{eq} = \frac{2 k_t k_b}{k_t + 2 k_b} \qquad (3)$$

To find the total equivalent stiffness, the stiffnesses of the torsional and bending members is calculated. The torsional stiffness $k_t$ is calculated by $$k_t = \frac{K_i G}{l_t} \qquad (4)$$

where G is the modulus of rigidity, $l_t$ is the length of the torsional member, and $K_i$ is a geometry-dependent parameter defined by $$K_i = w_t t^3 \left[ \frac{1}{3} - 0.21 \frac{t}{w_t} \left(1 - \frac{t^4}{12 w_t^4}\right) \right] \qquad (5)$$

where t is the thickness of the LET joint and $w_t$ is the width of the torsional member.

The bending stiffness $k_b$ is calculated by $$k_b = \frac{E w_b t^3}{12 l_b} \qquad (6)$$

where E is the modulus of elasticity, $w_b$ is the width of the bending member, and $l_b$ is the length of the bending member.

The shear stress in a non-circular torsion member can be modeled by the equation $$\tau_{max} = \frac{T_i}{Q} \qquad (7)$$

where $T_i$ is the torque applied to the torsional member and Q is a geometry-dependent parameter, defined for a rectangular cross section as follows:

$$Q = \frac{w_t^2 t^2}{3 w_t + 1.8 t} \qquad (8)$$

The bending stress in the bending members can be calculated by $$\sigma_{max} = \frac{6 T_i}{w_b t^2} \qquad (9)$$

where $T_i$ is the torque applied to the bending member, $w_b$ is the width of the bending member, and t is the thickness of the bending member.

It is important to note that $T_i$ for both shear and bending is equivalent to half of the moment applied to the joint, since there are two torsion and two bending members in parallel and the load is shared. Therefore, $T_i$ is given as $$T_i = \frac{M}{2} \qquad (10)$$

for a single LET joint.

The maximum Von Mises stress, $\sigma_{max,\,v}$, can then be calculated from $\tau_{max}$ and $\sigma_{max}$ as $$\sigma_{max,v} = \sqrt{\sigma_{max}^2 + 3 \tau_{max}^2} \qquad (11)$$

Combining equations 1 through 11 it is possible to determine the maximum stress in the joint with respect to the applied angular deflection θ as $$\sigma_{max,v} = \frac{K_i G}{l_i} \theta \sqrt{\frac{9}{w_b^2 t^4} + \frac{3}{4 Q^2}} \qquad (12)$$

In cases where m joints are arrayed in parallel, the torque on each joint is equal to the applied torque divided by m. In cases where n joints are arrayed in series, the angular deflection on each joint is equal to the total angular deflection divided by n. FIG. 6A shows, for example, an example array 600 which includes m=2 LET joints in parallel and n=5 LET joints in series. The maximum Von Mises stress of a LET joint array with m joints in parallel and n joints in series is then given by $$\sigma_{max,v} = \frac{2 k_t k_b \theta}{n(k_t + 2 k_b)} \sqrt{\frac{9}{w_b^2 t^4} + \frac{3}{4 Q^2}} \qquad (13)$$

Substituting equation 4 and 6 into equation 13 yields the following analytical model expression for the maximum Von Mises stress, $\sigma_{max,v}$ for an array of LET joints:

$$\sigma_{max,v} = \frac{2 \left(\frac{K_i G}{l_t}\right) \left(\frac{E w_b t^3}{12 l_b}\right)}{\left(\frac{K_i G}{l_t}\right) + 2 \left(\frac{E w_b t^3}{12 l_b}\right)} \sqrt{\frac{9}{w_b^2 t^4} + \frac{3}{4 Q^2}} \qquad (14)$$

The above analytical model expression can be verified using finite element analysis (FEA) described below.

Finite Element Analysis (FEA) Model

A finite element analysis can verify the analytical model expression (i.e., equation 14) for the maximum Von Mises stress, $\sigma_{max,v}$, for an array of LET joints. Various m×n arrays of LET joints (with m being the number of LET joints in parallel and n being the number of LET joints in series) can be modeled and then loaded to an angular deflection θ=180°. Various design languages (e.g., ANSYS Parametric Design Language) can be used to perform the analysis. In some implementations, for example, Solid186 elements can be used to model the torsional members, and Beam188 elements can be used to model the rigid regions (e.g., rigid panel 10c and rigid panel 10e) at the ends of the design. The model can be meshed into about 188 elements per torsional member. Because of the large deflection of the structure, a nonlinear solver can be used.

The FEA model results for the maximum Von Mises stress can be compared to the analytical model expression (equation 14, above) for the maximum Von Mises stress. Results of an example comparison of the analytical and finite element model results are listed in Table 1 in FIG. 6B. In Table 1, the Von Mises stress is listed based on a 180° angular displacement, and m is the number of LET joints in parallel and n is the number of LET joints in series (see FIG. 5). Further in Table 1, the differences between the results of the two models are expressed as a percentage of the total Von Mises stress. It may be noted that in all (or nearly all) cases, the differences are within 8%. Sources of error may include the assumptions that LET members can be loaded in pure tension and bending in the FEA model, and that all other components can be rigid.

Prototype Flexible Electronics Assembly

The analytical model and finite element analysis (FEA) model for determining the maximum Von Mises stress for an array of LET joints described above may facilitate the design of flexible electronics assemblies that use otherwise rigid substrates (e.g., traditional PCB substrates) to support electronic components. In assignee's facilities, one such design for a folding solar panel assembly can be prototyped and tested to investigate the feasibility of using an array of LET joints as a means of introducing flexibility in rigid PCB-based electronics.

Figure 7A:
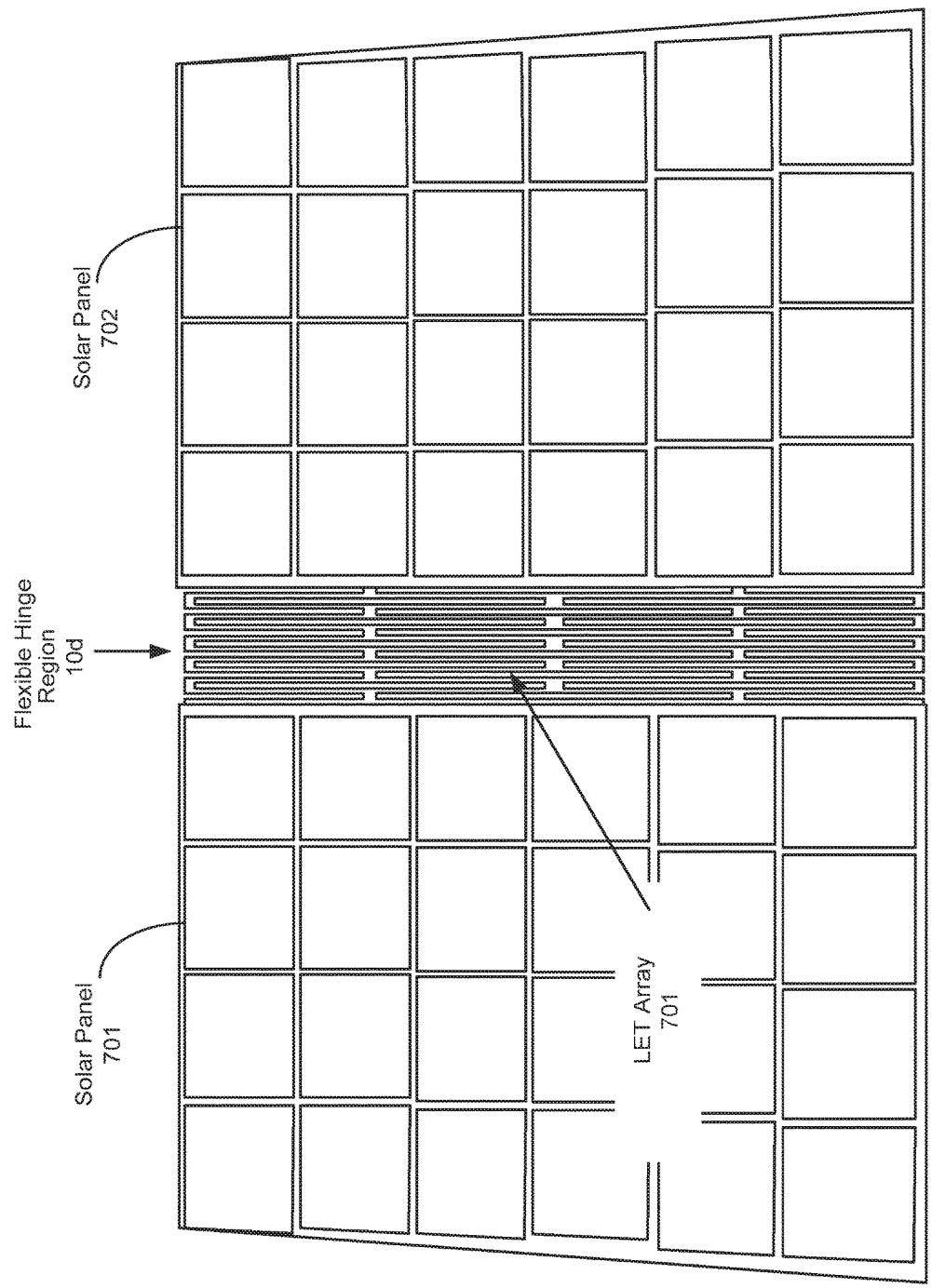
FIG. 7A is an illustration of an as-fabricated planar configuration of solar panels mounted on rigid portions of a copper-clad PCB substrate, in accordance with the principles of the present disclosure.
Figure 7B:
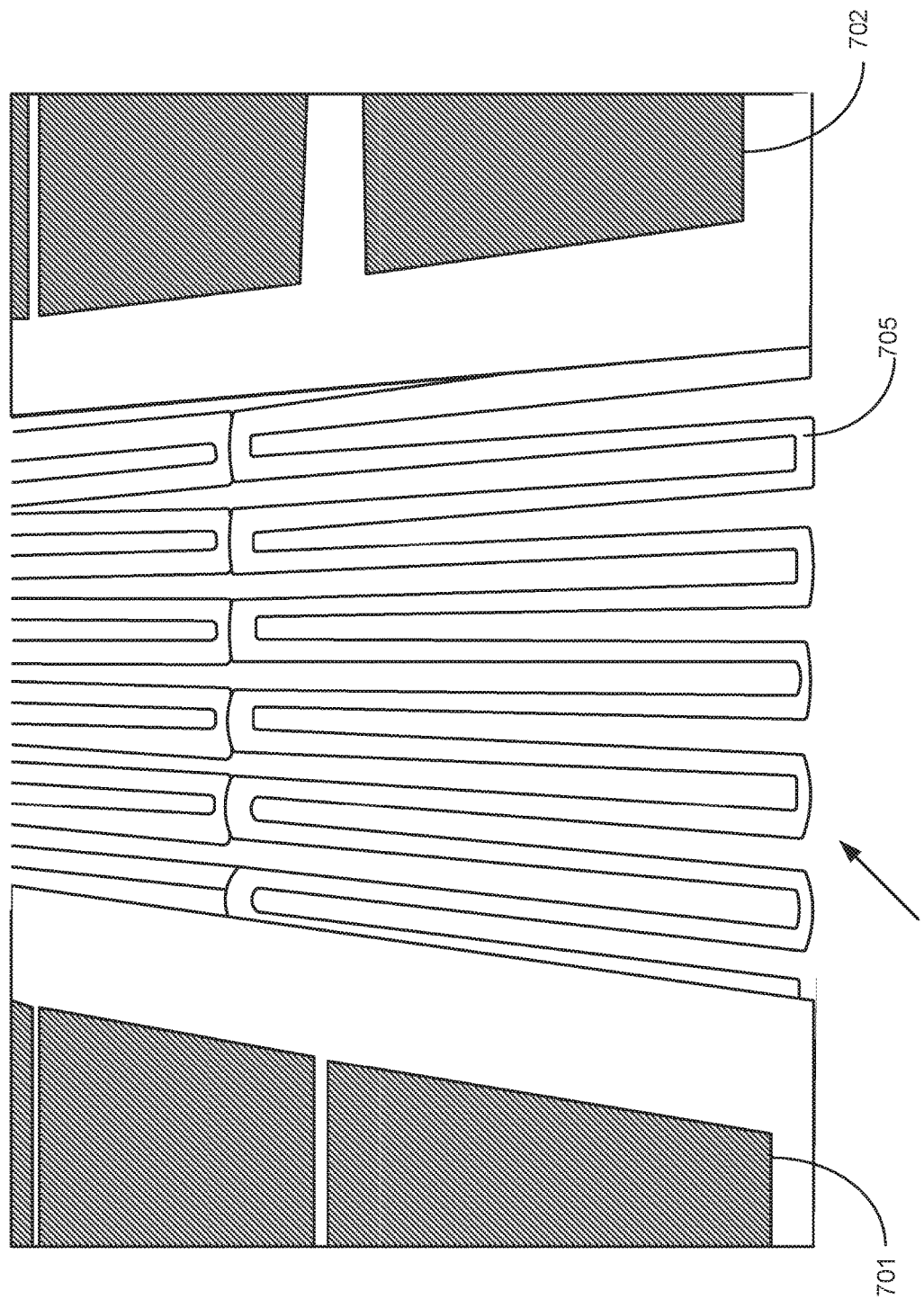
FIG. 7B is an illustration of an LET joint array used in the prototype folding solar panel assembly of FIG. 7A, in accordance with the principles of the present disclosure.
Figure 7C:
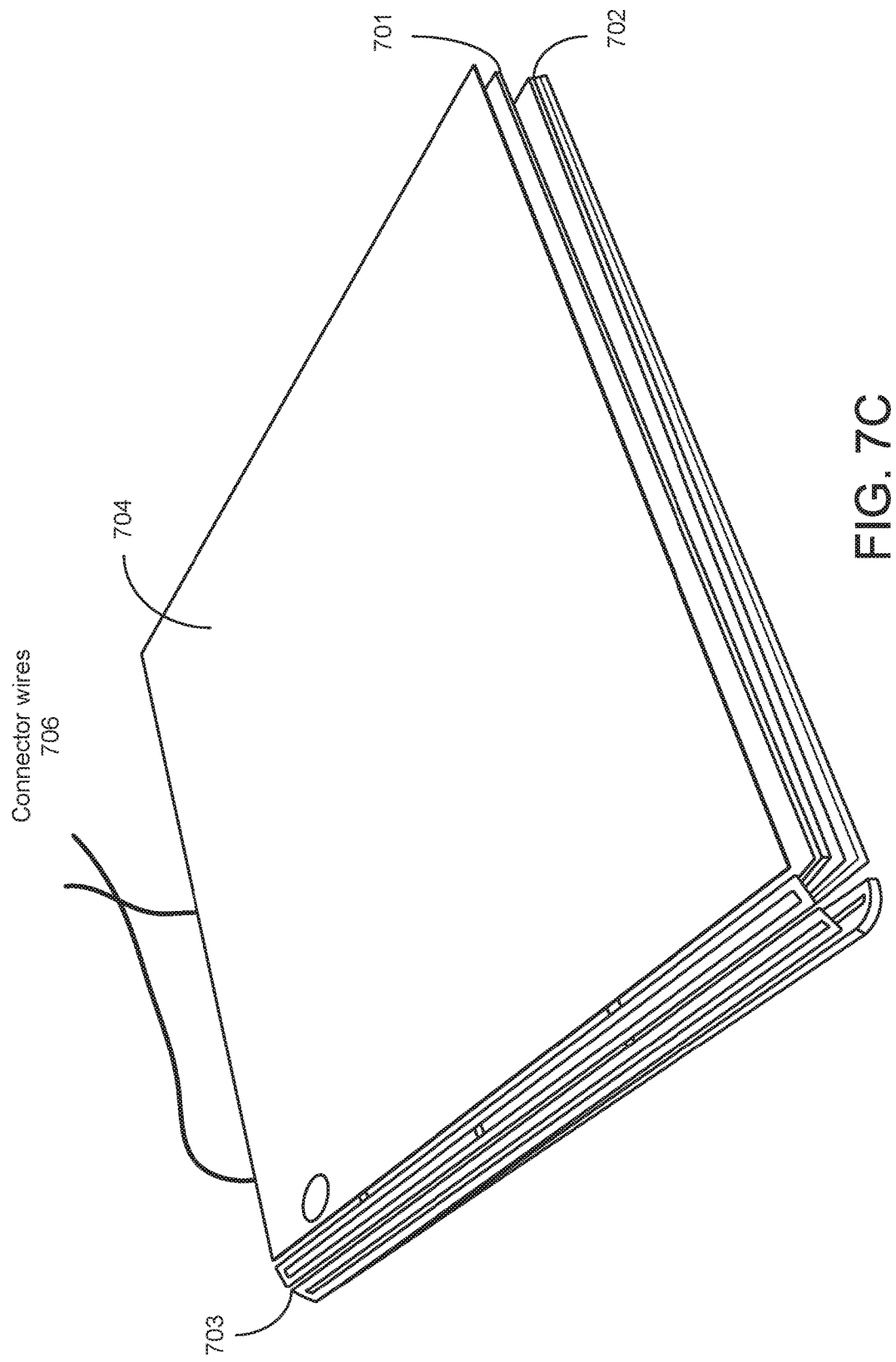
FIG. 7C is an illustration of the prototype folding solar panel assembly of FIG. 7A in a folded configuration, in accordance with the principles of the present disclosure.

FIGS. 7A, 7B and 7C show aspects of a folding solar panel assembly 700. Folding solar panel assembly 700 can be designed to fold 180° about a surrogate hinge, and stow in, for example, a backpack.

FIG. 7A shows an as-fabricated folding solar panel assembly 700 in a planar configuration with solar panel 701 and solar panel 702 mounted on rigid portions (e.g., like rigid panel 10c and rigid panel 10e) of a copper-clad PCB substrate (e.g., PCB substrate 704, FIG. 7C). The rigid portions of the PCB substrate are separated by a region of flexibility (e.g., like flexible region 10d) created by fabricating an array of LET joints 703 (similar to array 600) in the PCB substrate. Copper conductor traces (e.g. traces 705, FIG. 7B) across the array of LET joints 703 provided electrical connection between solar panel 701 and solar panel 702.

As designed, array of joints 703 included 2 LET joints in parallel and 5 LET joints in series (m=2, n=5). The torsional members of each LET joint had a length of $l_t$=3.68 and a width of $w_t$=0.13 cm. The bending members of each LET joint had a length of $l_b$=0.38 cm and a width of $w_b$=0.13 cm. Overall, the hinge section (i.e. array of joints 703) can be 15.24 cm along the bending axis and 2.16 cm perpendicular to the bending axis.

FIG. 7B provides a detail view of LET joint array 703 with exposed copper traces 705.

FIG. 7C shows a view of folding solar panel assembly 700 in a non-planar configuration in which solar panel 701 has been deflected by 180 degrees to be disposed on (e.g., lie on top of) solar panel 702 by hinging action of array of LET joints 703 in PCB substrate 704.

Folding solar panel assembly 700, as fabricated, demonstrates the ability to deflect 180° without mechanical failure or degradation of electrical performance.

To simulate repeated use of folding solar panel assembly 700, a fatigue testing device can be customized to accommodate the hinge portion (e.g. array of LET joints 703) of a PCB substrate (e.g., PCB substrate 704) used for folding solar panel assembly 700. Two copies of the hinge portion can be produced and tested. On each hinge portion, two electrically conducting traces can be routed through the LET joints on the top, and two electrically conducting traces can be routed through the LET joints on the bottom. A microcontroller (e.g., an Arduino Uno with ATmega328P) can be connected to each LET joint with a resistor in series and used as a voltage source and measurement device. The fatigue testing device can be used to repeatedly deflect rigid portions of the PCB substrate 180° at a rate of 20 cycles per minute. Voltage samples can be taken at a rate of 140 samples per minute to detect if conductivity of the electrically conducting traces routed through the LET joints can be interrupted or broken.

The samples can be deflected for 100,000 cycles. After the test, the samples can be inspected for mechanical failure. The resistance of each electrically conducting trace across the hinge can be also measured before and after testing. Results of the resistance measurements are listed in Table 2 in FIG. 8. In Table 2, resistance measurements on two boards before and after 1000,000 cycles of deflection are listed for each trace (e.g., traces A, B, C and D). All resistance values shown are in ohms (Ω).

As shown in Table 2, the average resistance change of the electrically conducting traces after 100,000 cycles can be only 1.9%. As no cracking or other mechanical failure of the electrically conducting traces can be observed, this small 1.9% increase in resistance is likely due to increased contact resistance from dust particles settling on the surface in the test environment.

Origami Folding Structures

To further demonstrate how the foregoing techniques for introducing flexible regions (i.e., arrays of LET joints) in a rigid substrate to form surrogate hinges allow manufacture of stowable PCB-based flexible electronic assemblies, a prototype origami-like structure can be designed and fabricated from a single sheet of epoxy-fiberglass laminate PCB (e.g., a copper-clad FR-4 fiberglass PCB).

Figure 9A:
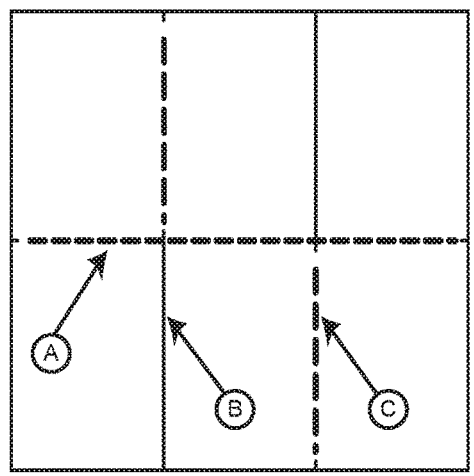
FIG. 9A is an illustration of an origami pattern used for a foldable PCB-based structure, in accordance with the principles of the present disclosure.
Figure 10:
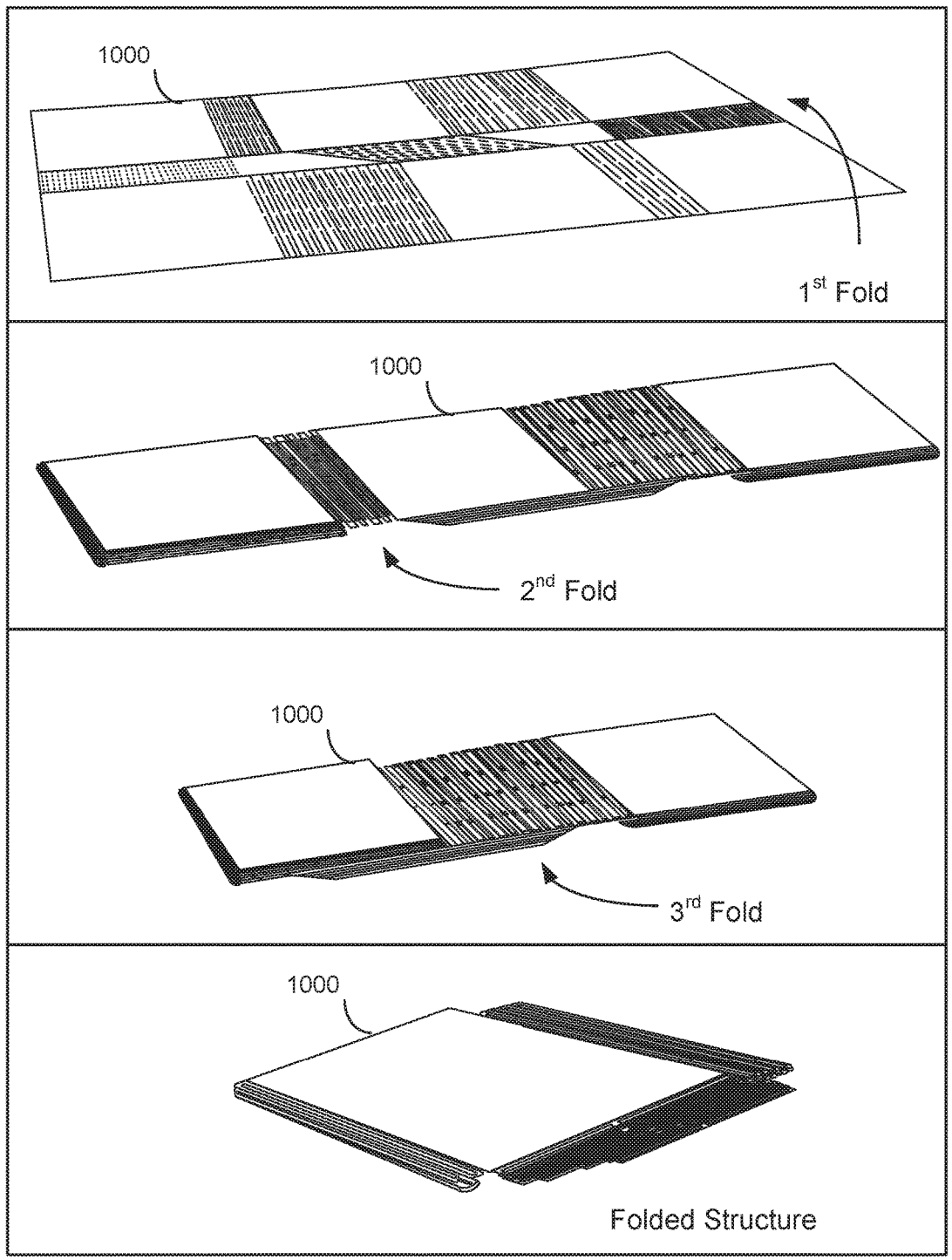
FIG. 10 is an illustration of an example origami-like folding structure for the origami that can be designed with optimized surrogate hinge LET joint arrays, and fabricated from a single sheet of copper-clad FR-4 PCB material, in accordance with the principles of the present disclosure.

FIG. 9A shows an origami pattern (e.g., map fold origami pattern 900) with two degree-four vertices that can be selected for the demonstrative prototype origami-like structure (e.g., fabricated structure 1000, FIG. 10). In FIG. 9A, labels A, B, and C indicate an order of folds for folding the single sheet PCB. The single sheet PCB is first folded in half on fold A and then folded in thirds on folds B and C.

Figure 9B:
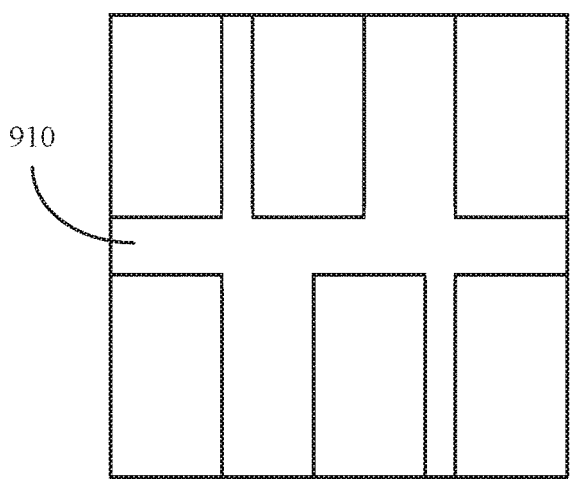
FIG. 9B is an illustration of fold regions in the origami pattern of FIG. 9A that can be made flexible with surrogate hinges for making a foldable PCB-based structure, in accordance with the principles of the present disclosure.
Figure 9C:
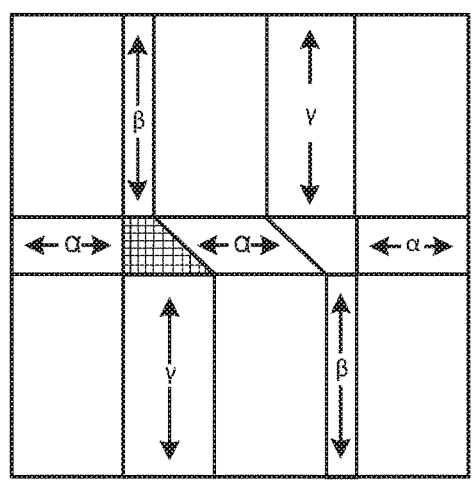
FIG. 9C is an illustration of regions of optimized surrogate fold geometry in the origami pattern of FIG. 9A for making a foldable PCB-based structure, in accordance with the principles of the present disclosure.

FIG. 9B shows regions 910 where flexibility can be added to a single sheet PCB to facilitate folding. FIG. 9C shows three surrogate hinge regions (labelled as α, β, and γ) that can be included in the single sheet PCB. Regions shown in a cross hatched pattern can be cut out. When the single sheet PCB is folded, the α regions are folded first, so the α regions can have (e.g., can be optimized to have) a small bend radius when folded. The β and γ regions are folded next, with γ regions folded around β regions. Therefore, the β regions can have (e.g., can be optimized to have) a small bend radius, and γ regions can have (e.g., can be optimized to have) a larger bend radius than the β regions to fold around the outside of the B folds.

For optimizing the geometry of surrogate hinge structures for the three surrogate hinge regions α, β, and γ, an optimization routine can be used for an array of LET joints with m members in parallel and n members in series. Mixed integer programming can be implemented using, for example, various algorithms (e.g., APMonitor modeling language and IPOPT solver). The structures for the three surrogate hinge regions α, β, and γ can be each solved separately. Inside fold regions α and β can (e.g., can be optimized to) reduce or minimize an objective function based on width of the fold while satisfying maximum Von Mises stress constraints. Outside fold region γ can (e.g., can be optimized to) reduce or minimize Von Mises stress while satisfying geometric constraints which would allow the g folds to be folded around the b folds.

The dimensions (e.g., optimized dimensions) for the surrogate hinge can be $w_t=0.10$ cm, $l_t=1.57$ cm, $w_b=0.10$ cm, and $l_b=0.10$ cm, with m=2 members in parallel and n=6 members in series. The dimensions (e.g., optimized dimensions) for the β hinge can be $w_t=0.10$ cm, $l_t=1.93$ cm, $w_b=0.10$ cm, and $l_b=0.10$ cm, with m=2 members in parallel and n=5 members in series. The dimensions (e.g., optimized dimensions) for the γ hinge can be $w_t=0.10$ cm, $l_t=1.83$ cm, $w_b=0.10$ cm, and $l_b=0.10$ cm, with m=2 members in parallel and n=15 members in series. The thickness (e.g., optimized thickness) of the structure can be 0.079 cm.

The entire prototype origami-like structure (e.g., fabricated structure 1000, FIG. 10) can be fabricated from a single sheet of PBC using, for example, a computer numerical control (CNC) mill to shape arrays of LET joints for the three surrogate hinge regions α, β, and γ in the single sheet of PBC.

FIG. 10 shows an example of the fabricated structure 1000 being folded sequentially. In its folded state, fabricated structure 1000 occupies approximately 17% of its original footprint.

FIG. 11 shows an example method 1100 for making PCB substrate-based flexible electronics, in accordance with the principles of the present disclosure.

In an example implementation, method 1100 includes geometrically modifying a single-piece substrate to include a localized region of flexibility separating two regions of rigidity (1110). The localized region of flexibility has a lower rigidity than the two regions of rigidity. Method 1100 further includes using the localized region of flexibility separating the two regions of rigidity as a hinge in the single-piece substrate to angularly deflect the two regions of rigidity from a planar configuration of the single-piece substrate to a non-planar configuration of the single-piece substrate (1120).

In method 1100, geometrically modifying a single-piece substrate to include a localized region of flexibility 1110 includes configuring the localized region of flexibility to elastically accommodate substantially all stresses and strains in the single-piece substrate caused by angular deflection of the two regions of rigidity.

Further, geometrically modifying a single-piece substrate to include a localized region of flexibility 1110 includes forming at least one compliant joint by geometrical shaping of the single-piece substrate. Forming the at least one compliant joint by geometrical shaping of the single-piece substrate may include forming a lamina emergent torsional (LET) joint. Forming at least one compliant joint by geometrical shaping of the single-piece substrate may include forming an array of LET joints In method 1100, forming the LET joint includes forming two torsional members and two bending members as sides of a rectangle circumscribing a rectangular slot cut in the localized region of flexibility, and configuring the LET joint to transfer a bending load associated with angular deflection of the two regions of rigidity and applied to the LET joint as a torsional load on the two torsional members of the LET joint.

In method 1100, the single-piece substrate may be a conductor clad printed circuit board (PCB) (e.g., a single sheet of copper-clad FR-4 fiberglass) with physical and chemical properties that conform to industry standard grades regulated by the National Electrical Manufacturers Association (NEMA), and geometrically modifying the single-piece substrate to include a localized region of flexibility 1110 may include forming an electrically conducting trace running across the localized region of flexibility.

Method 1100 may include utilizing the electrically conducting trace running across the localized region of flexibility to provide an electrical connection to at least one electronic component mounted that may be mounted on at least one of the two regions of rigidity.

In some example implementations wherein geometrically modifying the single-piece substrate to include a localized region of flexibility 1110 includes forming a plurality of localized regions of flexibility along fold axes of a map fold origami pattern.

The techniques describe herein may be used to conform PCBs to an arbitrary shape (e.g., for flexible electronics applications). For example, PCBs could be folded for installation in confined spaces. PCBs could be designed with multiple panels that could fit within a limited space or against the walls of a container. PCBs could be folded to save space in stowing and deployed for increased surface area during use.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the flexible circuit boards are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A flexible electronics assembly comprising:
   a single-piece substrate, the substrate including two regions of rigidity separated by a localized region of flexibility, the localized region of flexibility having a lower rigidity than the two regions of rigidity; and
   at least one electronic component mounted on at least one of the two regions of rigidity, the localized region of flexibility including a plurality of compliant joints, the plurality of compliant joints including at least a lamina emergent torsional (LET) joint and forming a hinge configured to angularly deflect, repeatedly, the two regions of rigidity:
   from a planar configuration of the single-piece substrate to a non-planar configuration of the single-piece substrate; and
   from the non- planar configuration of the single-piece substrate to the planar configuration of the single-piece substrate.

2. The flexible electronics assembly of claim 1, wherein the localized region of flexibility elastically accommodates substantially all stresses and strains in the single-piece substrate caused by angular deflection of the two regions of rigidity.

3. The flexible electronics assembly of claim 1, wherein the localized region of flexibility is a geometrically modified region of the single-piece substrate.

4. The flexible electronics assembly of claim 3, wherein the plurality of compliant joints include at least one compliant joint formed by geometrical shaping of the single-piece substrate.

5. The flexible electronics assembly of claim 4, wherein the at least one compliant joint formed by geometrical shaping of the single-piece substrate is a lamina emergent torsional (LET) joint.

6. The flexible electronics assembly of claim 4, wherein the at least one compliant joint formed by geometrical shaping of the single-piece substrate includes an array of LET joints in series and or in parallel.

7. The flexible electronics assembly of claim 5, wherein the LET joint includes two torsional members and two bending members as sides of a rectangle circumscribing a rectangular slot cut in the localized region of flexibility.

8. The flexible electronics assembly of claim 7, wherein the LET joint is configured to transfer a bending load associated with angular deflection of the two regions of rigidity and applied to the LET joint as a torsional load on the two torsional members of the LET joint.

9. The flexible electronics assembly of claim 1, wherein the single-piece substrate is a conductor clad substrate.

10. The flexible electronics assembly of claim 1, wherein an electrically conducting trace running across the localized region of flexibility provides an electrical connection to the at least one electronic component mounted on at least one of the two regions of rigidity.

11. The flexible electronics assembly of claim 1, wherein the single-piece substrate, includes a plurality of localized regions of flexibility disposed along fold axes of an origami pattern.

12. A printed circuit board comprising:
   a localized region of flexibility separating two regions of rigidity, the localized region of flexibility having a lower rigidity than the two regions of rigidity, the localized region of flexibility separating the two regions of rigidity, the localized region of flexibility including a plurality of compliant joints, the plurality of compliant joints including at least a lamina emergent torsional (LET) joint and forming a hinge configured to angularly deflect the two regions of rigidity, repeatedly:
   from a planar configuration of the printed circuit board to a non-planar configuration of the printed circuit board; and
   from the non-planar configuration of the printed circuit board to the planar configuration of the printed circuit board,
   wherein at least one of the two regions of rigidity of the printed circuit board is configured to receive an electronic device component mounted thereon.

13. The printed circuit board of claim 12, wherein the localized region of flexibility elastically accommodates substantially all stresses and strains in the printed circuit board caused by angular deflection of the two regions of rigidity.

14. The printed circuit board of claim 12, wherein the plurality of compliant joints include at least one geometrically shaped compliant joint in the printed circuit board.

15. The printed circuit board of claim 14, wherein the at least one geometrically shaped compliant joint in the printed circuit board includes at least one lamina emergent torsional (LET) joint.

16. The printed circuit board of claim 15, wherein the at least one
LET joint includes:
two torsional members and two bending members as sides of a rectangle circumscribing a rectangular slot cut in the localized region of flexibility, wherein the at least one LET joint transfers a bending load associated with angular deflection of the two regions of rigidity and applied to the LET joint as a torsional load on the two torsional members of the at least one LET joint.

17. The printed circuit board of claim 12, further including:
an electrically conducting trace running across the localized region of flexibility.

18. The printed circuit board of claim 12, wherein the localized region of flexibility includes a plurality of localized regions of flexibility along fold axes of an origami pattern.

* * * * *